United States Patent
Sferlazzo et al.

(10) Patent No.: US 8,225,527 B2
(45) Date of Patent: Jul. 24, 2012

(54) COOLING APPARATUS FOR A WEB DEPOSITION SYSTEM

(75) Inventors: Piero Sferlazzo, Marblehead, MA (US); Donald N. Polner, Marblehead, MA (US); Darren M. Simonelli, Seabrook, NH (US)

(73) Assignee: Aventa Technologies LLC, Danvers, MA (US)

( * ) Notice: Subject to any disclaimer, the term of this patent is extended or adjusted under 35 U.S.C. 154(b) by 161 days.

(21) Appl. No.: 12/832,229

(22) Filed: Jul. 8, 2010

(65) Prior Publication Data

US 2012/0006520 A1  Jan. 12, 2012

(51) Int. Cl.
F26B 11/02  (2006.01)
(52) U.S. Cl. ......... 34/413; 34/497; 34/117; 204/298.24; 427/398.1; 165/189; 431/328
(58) Field of Classification Search .......... 34/80, 90, 34/114, 116, 117, 259, 413, 497; 204/298.24; 427/398.1; 165/189; 431/328
See application file for complete search history.

(56) References Cited

U.S. PATENT DOCUMENTS

| | | | | |
|---|---|---|---|---|
| 2,603,457 A | * | 7/1952 | Bishop | 165/89 |
| 2,984,472 A | * | 5/1961 | Marks | 432/135 |
| 3,414,048 A | | 12/1968 | Rall | |
| 3,452,967 A | * | 7/1969 | Durand | 432/228 |
| 3,643,344 A | * | 2/1972 | Strube | 34/124 |
| 3,662,821 A | * | 5/1972 | Saxon | 165/89 |
| 3,675,337 A | * | 7/1972 | Daane | 34/454 |
| 3,729,180 A | * | 4/1973 | Bourrel et al. | 432/228 |
| 3,997,953 A | * | 12/1976 | Christ et al. | 492/2 |
| 4,090,841 A | * | 5/1978 | Kramlehner | 432/60 |
| 4,457,359 A | | 7/1984 | Holden | |
| 4,508,161 A | | 4/1985 | Holden | |
| 4,512,391 A | | 4/1985 | Harra | |
| 4,542,298 A | | 9/1985 | Holden | |
| 4,627,176 A | * | 12/1986 | Brieu | 34/115 |
| 4,688,335 A | * | 8/1987 | Krill et al. | 34/273 |
| 4,693,015 A | * | 9/1987 | Hemsath et al. | 34/454 |

(Continued)

FOREIGN PATENT DOCUMENTS

JP  60002665 A  1/1985

(Continued)

OTHER PUBLICATIONS

Sferlatzo, et al.; "Web Substrate Deposition System"; U.S. Appl. No. 12/466,221.

(Continued)

*Primary Examiner* — Stephen M. Gravini
(74) *Attorney, Agent, or Firm* — William G. Guerin; Guerin & Rodriguez, LLP

(57) ABSTRACT

Described are an apparatus and a method for cooling a web. The apparatus includes an inner cylinder having a void therein and configured for coupling to a gas source. The apparatus also includes an outer cylinder having an inner surface, an outer surface to support a web and apertures between the inner and outer surfaces. The outer cylinder rotates about the inner cylinder so that gas provided to the void of the inner cylinder flows through the apertures that are adjacent to the void and passes to the outer surface of the outer cylinder to increase the heat transfer between the web and the outer cylinder. The volume of gas introduced into the vacuum deposition chamber during a process run is thereby limited. Advantageously, the apparatus enables higher deposition rates and increased productivity.

8 Claims, 3 Drawing Sheets

U.S. PATENT DOCUMENTS

| | | | |
|---|---|---|---|
| 5,076,203 A | 12/1991 | Vaidya et al. | |
| 5,791,065 A * | 8/1998 | Gamble et al. | 34/110 |
| 7,690,131 B2 * | 4/2010 | Mausser et al. | 34/124 |
| 2012/0006520 A1 * | 1/2012 | Sferlazzo et al. | 165/185 |

FOREIGN PATENT DOCUMENTS

| | | |
|---|---|---|
| JP | 2004143520 A | 5/2004 |
| JP | 2008150636 A | 7/2008 |
| WO | 2009072242 A1 | 6/2009 |

OTHER PUBLICATIONS

International Search Report and Written Opinion in counterpart PCT Application No. PCT/US2011/042084, dated Feb. 9, 2012; 10 pages.

Sferlatzo, et al.; "Web Substrate Deposition System"; U.S. Appl. No. 12/466,221, May 3, 2012.

Ion Implantation Science and Technology, 2006 Edition, IIT Press (2006), M.E. Mack; pp. 539-560.

\* cited by examiner

COOLING APPARATUS FOR A WEB DEPOSITION SYSTEM

FIELD OF THE INVENTION

The invention relates generally to an apparatus and method for cooling a web during a deposition process. More particularly, the invention relates to an apparatus for cooling a web by injecting gas between the web and a rotating cooling cylinder.

BACKGROUND OF THE INVENTION

Roll to roll thin film vacuum deposition is often used to coat flexible materials such as plastics, metals and polyimide. In typical configurations a material or web substrate is unwound from a payout roll into a processing chamber. After a series of steps are performed, the coated web substrate is wound onto a take-up roll. Many of the deposition technologies that are commonly used require high vacuum conditions, for example, a pressure below 1 Torr. High vacuum deposition technologies include vacuum evaporation and sputtering, often referred to generically as physical vapor deposition. The deposition process induces a heat load on the web, resulting in an increase in temperature. A variety of sources may generate the heat load. For example, the heat load can be due to the heat of condensation of the growing film, a hot surface of the process apparatus that is in the line of sight of the web substrate, and ion or electron currents due to proximity to a plasma during sputtering. In many applications, the increase in the temperature of the web is unacceptable. For example, at high coating speeds and web transport rates, the heat load can cause the web to wrinkle and crease, possibly resulting in permanent damage to the web. As the heat load is typically proportional to the deposition rate, the throughput of the deposition system is severely limited. Consequently, a means to cool the web during deposition can be used to increase the throughput and productivity of the deposition system.

A rotating cooling drum can be used to cool the web during the deposition process. The thermal conductance between the web and the cooling drum affects the ability to control the temperature rise of the web during the coating process, and sets an upper limit to the coating speed. The cooling drum can be used to introduce a gas between the drum surface and the web to increase the rate of heat transfer; however, the gas is introduced in the vacuum region of the system and therefore can adversely affect the deposition process. U.S. Pat. No. 3,414,048 describes a cooling drum that has pistons distributed about the drum surface such that only pistons that are adjacent to the web are activated to provide gas. The other pistons are closed and therefore do not introduce gas into the vacuum environment. However, the cooling drum is mechanically complex as a large number of pistons are required along the surface of the drum to provide a sufficient distribution of the gas between the web and the drum. Thus the cooling drum is expensive and requires significant time to assemble. Moreover, the large number of moving parts can decrease operational reliability.

SUMMARY

In one aspect, the invention features an apparatus for cooling a web. The apparatus includes an inner cylinder and an outer cylinder. The inner cylinder has a void and is configured for coupling to a gas source. The outer cylinder has an inner surface, an outer surface to support a web, and a plurality of apertures between the inner surface and the outer surface. The outer cylinder is concentric with the inner cylinder and is configured to rotate about the inner cylinder. A gas provided to the void of the inner cylinder flows through the apertures that are adjacent to the void and passes to the outer surface of the outer cylinder to thereby increase heat transfer between the web and the outer cylinder.

In another aspect, the invention features a method of cooling a web. The method includes supplying a gas to a void in a first cylinder. The void is defined over an arc angle with respect to a cylindrical axis of the first cylinder. A web is transported on a portion of an outer surface of a second cylinder that is concentric with the first cylinder. The second cylinder has an inner surface and a plurality of apertures between the inner surface and the outer surface. The second cylinder is rotated with respect to the first cylinder to flow the gas from the void through the apertures that are adjacent to the void. Gas is thereby provided to the portion of the outer surface of the second cylinder to increase the heat transfer between the web and the second cylinder.

BRIEF DESCRIPTION OF THE DRAWINGS

The above and further advantages of this invention may be better understood by referring to the following description in conjunction with the accompanying drawings, in which like numerals indicate like structural elements and features in the various figures. For clarity, not every element may be labeled in every figure. The drawings are not necessarily to scale, emphasis instead being placed upon illustrating the principles of the invention.

DETAILED DESCRIPTION

Figure 1A:
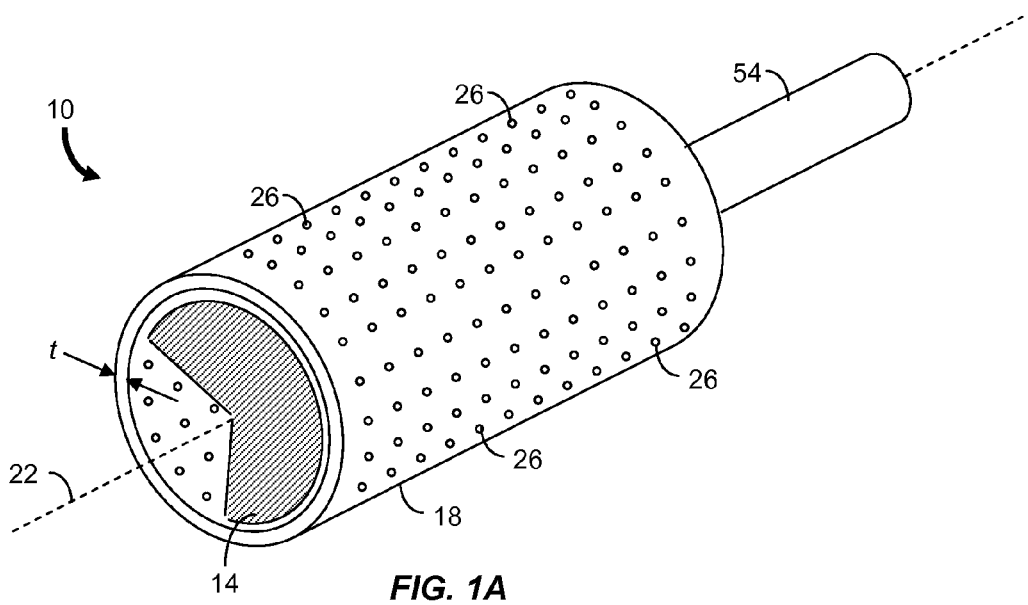
FIG. 1A is a cut-away illustration of an embodiment of an apparatus for cooling a web according to the invention.

A common technique for cooling a web in a vacuum environment is to transport the web over a cooled roll or drum so that heat is transferred to the drum through contact. Cooling is adjusted by varying the temperature of the roll and the wrap angle of the web around the roll. The cooling rate is proportional to $h*(T_0-7)$ where h is the heat transfer coefficient, $T_0$ is the temperature of the cooling roll and T is the temperature of the web. In vacuum, the interface between two materials generally does not have a high heat transfer coefficient h. More specifically, the natural roughness of a material at a microscopic level results in sharp points of contact; however, as heat conduction is proportional to the cross-sectional contact area, the transfer of heat across the interface is substantially limited. The introduction of a pliable material, such as an elastomer or a gas, between the materials results in a substantial improvement in cooling efficiency. The pliable material increases the effective area of contact while the gas provides a heat conduction path between the materials.

In many applications, the pressure for sufficient gas conduction is in a range from less than 10 Torr to more than 20 Torr. To sustain this pressure, a force is applied between the web and the cooling device, and gas is injected into the micro-spaces between the two surfaces. This gas injection technique has been applied to achieve cooling of semiconductor wafers using a cooling chuck. Multiple gas injectors are used to achieve a uniform pressure between the wafer and the chuck. The resulting gas load to the vacuum chamber is generally low and does not interfere with the deposition process.

In web coating applications, the web is continuously transported on a rotating roll so that trapping a gas between the web and the roll is more complicated than the technique used with semiconductor wafer coating applications. Multiple gas injectors can be provided around the circumference of the roll. During operation, the roll is continuously rotating and the wrap angle for most applications typically limits the contact between the web and the surface of the roll. Thus many of the injectors introduce gas directly into the chamber, thereby increasing the load to the vacuum system while not contributing to the cooling of the web.

The apparatus of the present invention provides a high heat transfer between a web and the apparatus while limiting the volume of gas introduced into the vacuum deposition chamber during a process run. Advantageously, the apparatus enables higher deposition rates and increased productivity. The apparatus does not require moving parts other than a rotating cylindrical component. No pistons, actuators, valves, switches or similar parts are required. Thus the complexity and cost for manufacturing the apparatus are reduced in comparison to prior art cooling drums and reliability during operation is increased.

The apparatus can be used with a variety of web substrates and coating materials. By way of a specific example, the web can be a stainless foil substrate having a thickness in a range of approximately 25 µm to 100 µm. Other substrate thicknesses and other substrate materials, such as polyimide, aluminum, titanium and copper, can be used. Examples of materials that can be deposited on the web substrate include molybdenum, chromium, titanium and oxides, such as silicon dioxide and zinc oxide. Film thicknesses typically are in a range of approximately 50 nm to 1,000 nm, although other thicknesses can be used.

Figure 1B:
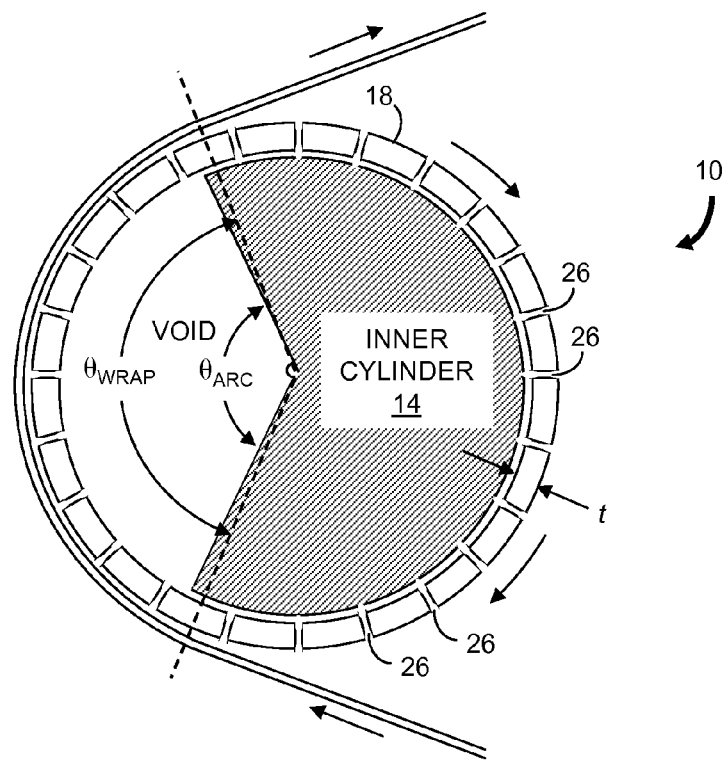
FIG. 1B is a cross-sectional illustration of the apparatus of FIG. 1A.

FIG. 1A illustrates a cut-away perspective view and FIG. 1B illustrates a cross-sectional view of an embodiment of an apparatus 10 for cooling a web according to the invention. The apparatus 10 includes concentric inner and outer cylinders 14 and 18, respectively. The inner cylinder 14 is comprised of a solid material such as aluminum and has a void or "cut out" region that is substantially pie-shaped. The void defines an arc through an angle $\alpha_{ARC}$ that extends in length parallel to the cylindrical axis 22. The outer cylinder 18 can also be fabricated from aluminum or other material with a high thermal conductivity. The outer cylinder 18 has a hollow configuration and includes a plurality of radial channels or apertures 26 that extend through the thickness t of the cylinder wall. In a preferred embodiment, the outer surface of the inner cylinder 14 and the inner surface of the outer cylinder 18 are honed to a fine finish to act as a bushing. During a deposition process run, the inner cylinder 14 remains stationary while the outer cylinder 18 supports a web 30 and rotates about the common cylindrical axis 22. In preferred embodiments, the wrap angle $\alpha_{WRAP}$ of the web substrate is approximately equal to the arc angle $\alpha_{ARC}$ of the void.

In some embodiments, the apertures 26 have a diameter that is in a range of approximately 0.2 mm to 2 mm although other diameters can be used. As illustrated, the apertures 26 are uniformly sized and uniformly distributed about the outer cylinder 18. In other embodiments the pattern, shape and size of the apertures 26, and the number of apertures 26 can vary.

In some embodiments, the outer cylinder 18 includes an elastomeric coating formed on the outer surface to increase the heat transfer between the web substrate 30 and the cylinder 18. The elastomeric coating includes apertures that are aligned with the apertures 26 in the outer cylinder 18.

Figure 2:
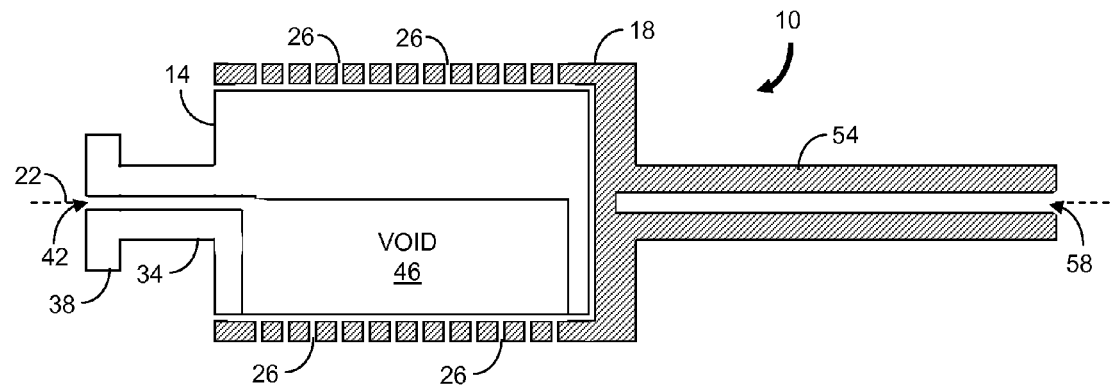
FIG. 2 is a cross-sectional illustration of the apparatus of FIG. 1A and FIG. 1B.
Figure 3A:
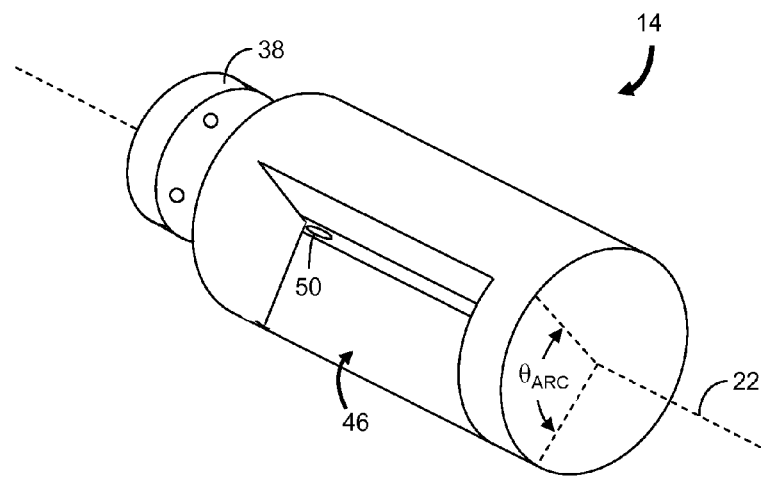
FIG. 3A is an illustration of the inner cylinder of the apparatus of FIG. 1A and FIG. 1B.
Figure 3B:
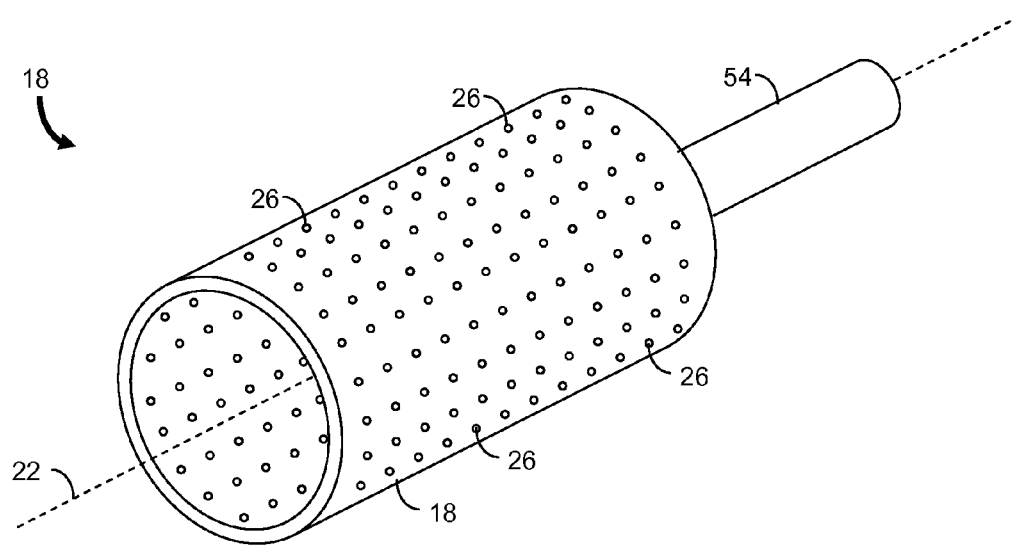
FIG. 3B is an illustration of the outer cylinder of the apparatus of FIG. 1A and FIG. 1B.

FIG. 2 is a cross-sectional view of the apparatus 10 of FIG. 1A and shows an axial extension 34 and flange 38 extending from the inner cylinder 14. FIG. 3A and FIG. 3B show independent views of the inner cylinder 14 and outer cylinder 18, respectively.

The flange 38 acts as a means to secure the inner cylinder 14 to a stationary structure, for example, by bolting the flange 38 to the structure. An axial channel 42 extends through the flange 38 and extension 34 to permit gas to be introduced to the void 46. The axial channel 42 terminates at a port 50 where the gas enters the void 46.

The outer cylinder 18 includes an extension 54 that has a conduit or axial channel 58 to pass a coolant. In one embodiment, the coolant is water although the coolant can be another liquid that maintains the outer cylinder 18 at a temperature sufficient to control the temperature of the web 30 during the deposition process. For example, the coolant can be a hydrocarbon oil that can achieve a temperature that is lower than the freezing point of water or higher than the boiling point of water (e.g., 300° C.). In effect, the outer cylinder 18 acts as a heat sink where the temperature of the cylinder 18 can be controlled by controlling the temperature of the coolant. The heat transfer between the outer cylinder 18 and the web 30 can be controlled by various means. For example, the flow rate of the cooling gas can be controlled using a gas solenoid to adjust or maintain the pressure of the gas between the outer cylinder 18 and the web 30. In a preferred embodiment, the pressure is maintained in a range of approximately 10-20 Torr.

The extension 54 of the outer cylinder 18 is configured for coupling to a motor for rotation about the common cylindrical axis. For example, the extension 54 may be coupled to a pulley or other rotational drive mechanism that engages a motor axis.

During operation, as each aperture 26 in the outer cylinder 18 passes by the void 46 in the inner cylinder 14, gas passes through the aperture 26 to pressurize the adjacent portion of the surface of the web 30. Preferably, the gas is helium, hydrogen, argon or another gas having a high thermal conductivity. As the outer cylinder 18 continues to rotate and the aperture 26 is no longer adjacent to the void 46, the aperture 26 ceases to conduct gas. Thus the apparatus 10 only supplies gas through those apertures 26 that are within the void arc angle $\alpha_{ARC}$ and therefore the gas introduced into the vacuum deposition chamber is substantially reduced. Consequently, gas consumption is less and the gas load on the vacuum system is decreased. The trapped layer of cooling gas between the outer cylinder 18 and the web 30 substantially increases the efficiency of heat transfer so that higher deposition rates are possible. In addition, the trapped gas reduces stress and wrinkles in the web 30 that are due to the thermal expansion caused by temperature changes to the web 30 during the deposition process.

The illustrated apparatus 10 shows only a single rotating cylinder, that is, the rotating outer cylinder 18. In alternative embodiments, the inner cylinder 14 rotates while the outer cylinder 14 is held stationary or both the inner cylinder 14 and outer cylinder 18 rotate at different rates and/or in opposite directions. In these alternative embodiments, a relative rotational motion is achieved that permits the apertures 26 to supply gas to the web 30 only over a limited portion of their circular paths.

Referring again to FIG. 1A and FIG. 1B, an embodiment of a method of cooling a web according to the invention includes supplying a gas to the void of the inner cylinder 14. The web 30 is transported on a portion of the outer surface of the outer cylinder 18 corresponding to a wrap angle $\alpha_{WRAP}$ that is approximately equal to the arc angle $\alpha_{ARC}$ of the void 46. Relative rotation between the inner and outer cylinders 14 and 18 enables gas to flow gas through the apertures 26 that are adjacent to the void 46. Thus gas is provided between the outer surface of the outer cylinder 18 and the web 30 to increase the efficiency of heat transfer. The temperature of the outer cylinder 18 can be controlled to thereby control a temperature of the web 30.

Embodiments described above are primarily related to web cooling applications for vacuum deposition systems; however, it should be recognized that the apparatus can be used to cool a web during any process that heats the web in a vacuum environment. For example, the apparatus can be used in conjunction with a plasma cleaning application. The invention also contemplates embodiments in which the direction of heat transfer is reversed. In these embodiments, the outer cylinder acts as a heat source and the apparatus is used to heat the transported web.

While the invention has been shown and described with reference to specific embodiments, it should be understood by those skilled in the art that various changes in form and detail may be made therein without departing from the spirit and scope of the invention as recited in the accompanying claims.

What is claimed is:

1. An apparatus for cooling a web, comprising:
    an inner cylinder having a void therein and configured for coupling to a gas source, the void extending along at least a portion of a length of the inner cylinder and having an arc angle with respect to a cylindrical axis of the inner cylinder; and
    an outer cylinder having an inner surface, an outer surface to support a web and a plurality of apertures between the inner surface and the outer surface, the outer cylinder being concentric to the inner cylinder and rotatable about the inner cylinder, wherein a gas provided to the void of the inner cylinder flows through the apertures that are adjacent to the void and passes through the outer surface and out of the outer cylinder to thereby increase heat transfer between the web and the outer cylinder.

2. The apparatus of claim 1 further comprising a conduit coupled to the outer cylinder to pass a fluid that controls a temperature of the outer cylinder.

3. The apparatus of claim 1 wherein a temperature of the outer cylinder is less than a temperature of the web so that heat is transferred from the web to the outer cylinder to cool the web.

4. The apparatus of claim 1 wherein a temperature of the outer cylinder is greater than a temperature of the web so that heat is heat is transferred from the outer cylinder to the web to heat the web.

5. The apparatus of claim 1 further comprising a deposition source positioned to deposit a material on a surface of the web.

6. A method of cooling a web, the method comprising:
    supplying a gas to a void in a first cylinder, the void having a substantially pie-shaped cross-section that extends along a length of the first cylinder and defines an arc angle with respect to a cylindrical axis of the first cylinder;
    transporting a web on a portion of an outer surface of a second cylinder that is concentric with the first cylinder, the second cylinder having an inner surface and a plurality of apertures between the inner surface and the outer surface; and
    rotating the second cylinder with respect to the first cylinder to flow the gas from the void through the apertures that are adjacent to the void and out of the second cylinder to thereby provide the gas between the web and the portion of the outer surface of the second cylinder to increase heat transfer between the web and the second cylinder.

7. The method of claim 6 further comprising controlling a temperature of the second cylinder.

8. The apparatus of claim 1 wherein the arc angle of the void does not exceed a wrap angle of the web.

* * * * *